United States Patent
Gardner et al.

(12) 
(10) Patent No.: US 6,225,201 B1
(45) Date of Patent: May 1, 2001

(54) ULTRA SHORT TRANSISTOR CHANNEL LENGTH DICTATED BY THE WIDTH OF A SIDEWALL SPACER

(75) Inventors: Mark I. Gardner, Cedar Creek; Derrick J. Wristers, Austin; Jon D. Cheek; Thomas E. Spikes, Jr., both of Round Rock, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/433,801

(22) Filed: Nov. 3, 1999

Related U.S. Application Data (62) Division of application No. 09/036,896, filed on Mar. 9, 1998, now abandoned.

(51) Int. Cl.[7] .............................................. H01L 21/3205
(52) U.S. Cl. .......................................... 438/585; 438/947
(58) Field of Search .................................. 438/585, 305, 438/301, 303, 947

(56) References Cited

U.S. PATENT DOCUMENTS

| | | |
|---|---|---|
| 4,419,809 | 12/1983 | Riseman et al. . |
| 5,202,272 | 4/1993 | Hsieh et al. . |
| 5,698,881 | 12/1997 | Yoshitomi et al. . |
| 5,705,414 * | 1/1998 | Lustig . |
| 5,866,934 | 2/1999 | Kadosh et al. . |
| 5,918,132 * | 6/1999 | Qian et al. ............................ 438/299 |
| 5,923,981 * | 7/1999 | Qian ..................................... 438/284 |
| 5,950,091 * | 9/1999 | Fulford, Jr. et al. ................. 438/303 |
| 6,022,815 * | 2/2000 | Doyle et al. ......................... 438/947 |
| 6,066,534 * | 5/2000 | Son ...................................... 438/299 |
| 6,103,605 * | 8/2000 | Hopper ................................. 438/585 |
| 6,124,174 * | 9/2000 | Gardner et al. ...................... 438/303 |
| 6,136,675 * | 10/2000 | Lee ....................................... 438/585 |
| 6,140,167 * | 10/2000 | Gardner et al. ...................... 438/197 |

\* cited by examiner

*Primary Examiner*—Richard Booth
(74) *Attorney, Agent, or Firm*—Kevin L. Daffer; Conley, Rose & Tayon (57) ABSTRACT

An integrated circuit fabrication process is provided for forming a transistor having an ultra short channel length dictated by the width of a sidewall spacer which either embodies a gate conductor for the transistor or is used to pattern an underlying gate conductor. In one embodiment, the sidewall spacers are formed upon and extending laterally from the opposed sidewall surfaces of a sacrificial material. The sidewall surfaces of the sacrificial material are defined by forming the sacrificial material within an opening interposed laterally between vertically extending sidewalls which bound a gate dielectric. An upper portion of the gate dielectric is removed to partially expose the sidewall surfaces arranged at the periphery of the sacrificial material. Polysilicon spacers are formed exclusively upon the sidewall surfaces of the sacrificial material to define a pair of gate conductors having relatively small lateral widths. Portions of the gate dielectric not arranged exclusively beneath the gate conductors may be selectively removed. In another embodiment, sidewall spacers are used to protect select regions of a polysilicon gate material arranged exclusively underneath the spacers from being etched. The sidewall spacers are formed upon and extending laterally from sidewall surfaces arranged at the periphery of an opening which extends through a masking or sacrificial material to an underlying polysilicon gate material. The sidewall spacers are sacrificial in that they are removed from the semiconductor topography after they have served their purpose of masking the underlying polysilicon gate material.

23 Claims, 7 Drawing Sheets

ULTRA SHORT TRANSISTOR CHANNEL LENGTH DICTATED BY THE WIDTH OF A SIDEWALL SPACER

This is a Division of application Ser. No. 09/036,896, filed Mar. 9, 1998 now abandoned.

BACKGROUND OF THE INVENTION

1. Field of the Invention

This invention relates to integrated circuit fabrication and, more particularly, to forming a transistor having an ultra short channel length dictated by the width of a sidewall spacer which either embodies a gate conductor for the transistor or is used to pattern an underlying gate conductor.

2. Description of the Related Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source/drain regions (i.e., junctions) adjacent to and on opposite sides of the gate conductor within the substrate. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

Because of the increased desire to build faster and more complex integrated circuits, it has become necessary to reduce the transistor threshold voltage, $V_T$. Several factors contribute to $V_T$, one of which is the effective channel length ("Leff") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In VLSI designs, as the physical channel length decreases, so too must the Leff. Decreasing Leff reduces the distance between the depletion regions associated with the source and drain of a transistor. As a result, less gate charge is required to invert the channel of a transistor having a shorter Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, typically ultraviolet light, through the transparent portions of a mask plate. The solubility of photoresist regions exposed to the radiation is altered by a photochemical reaction. The photoresist is washed with a solvent that preferentially removes resist areas of higher solubility. Those exposed portions of the polysilicon material not protected by photoresist are etched away, defining the geometric shape of a polysilicon gate conductor.

The lateral width (i.e., the distance between opposed sidewall surfaces) of the gate conductor which dictates the physical channel length of a transistor is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, scattering the radiation and therefore adversely affecting the resolution of the optical system. As such, the features patterned upon a masking plate may be skewed, enlarged, shortened, or otherwise incorrectly printed onto the photoresist.

In most core logic areas of an integrated circuit there are numerous logic gates, e.g., NAND and NOR gates, and interconnection between those gates. While reducing the Leff of each gate conductor within a logic gate increases the operational frequency and the integration density of an integrated circuit, other factors must also be manipulated to maximize circuit complexity and speed. For example, the spacing between series-connected transistors within a multiple-input logic gate must be decreased to provide for high packing density and high-speed operation of the logic gate. Unfortunately, the spacing between the gate conductors is mandated by the minimum definable dimension of lithography. The geometric shape of the gate conductors is generally defined by lithographically patterning photoresist over regions of a gate conductor material to be retained for the gate conductors. The minimum distance between portions of the photoresist patterned over the gate conductor material is limited by the constraints of lithography. Therefore, the lateral width of each region of the gate conductor material etched to form the gate conductors cannot be reduced below, e.g., 0.2 micron. As such, the minimum spacing between gate conductors within a logic gate is sacrificed by the conventional procedure of using lithography to pattern the gate conductors.

It would therefore be desirable to develop a transistor fabrication technique in which the channel length of the transistor is reduced to provide for high frequency operation of an integrated circuit employing the transistor. More specifically, a process is needed in which the channel length is no longer dictated by the resolution of a lithography optical aligner. The lateral width of a gate conductor which defines the channel length of a transistor must no longer be determined by an image printed onto photoresist Otherwise, the image could be altered during optical lithography, resulting in the dimensions of the gate conductor being altered from design specifications. A process which avoids the limitations of lithographic exposure used for defining opposed sidewall surfaces (i.e., boundaries) of conventional gate conductors would beneficially allow the channel length, and hence the Leff, of a transistor to be scaled to a smaller size. Minimizing the Leff of a transistor would advantageously increase the speed at which the logic gates of a transistor switch between its on and off states. It would also be of benefit to develop a method for forming a transistor in which the spacing between the gate conductors of a logic gate is no longer limited by the minimum definable dimension of lithography. Such a method would afford high-speed operation and increased integration density of an integrated circuit.

SUMMARY OF THE INVENTION

The problems outlined above are in large part solved by the technique hereof for fabricating a transistor in which the channel length is controlled by the lateral thickness of a sidewall spacer. In one embodiment, sidewall spacers embody the gate conductors of a pair of series-connected transistors. The sidewall spacers are formed upon and extending laterally from the opposed sidewall surfaces of a sacrificial material. The sidewall surfaces of the sacrificial material are defined by depositing the sacrificial material into an opening interposed laterally between vertically extending sidewalls which bound a gate dielectric. Vertically extending sidewall surfaces encompassing the sacrificial material are thus formed at the junction between the gate dielectric and the sacrificial material. An upper portion of the gate dielectric is then removed to partially expose the sidewall surfaces arranged at the periphery of the sacrificial material. Polysilicon spacers are formed exclusively upon the sidewall surfaces of the sacrificial material to define a pair of gate conductors having relatively small lateral widths. Portions of the gate dielectric not arranged exclusively beneath the gate conductors may be selectively removed. In another embodiment, sidewall spacers are used to protect select regions of a polysilicon gate material arranged exclusively underneath the spacers from being etched. Those select regions of the polysilicon layer are to be the gate conductors of a pair of series-connected transistors. The sidewall spacers are formed upon and extending laterally from sidewall surfaces arranged at the periphery of an opening which extends through a masking or sacrificial material. The sidewall spacers are sacrificial in that they are removed from the semiconductor topography after they have served their purpose of masking the underlying polysilicon gate material.

In either embodiment, sidewall spacers are formed by chemically-vapor depositing a spacer material across a semiconductor topography comprising a pair of vertically extending sidewall surfaces. The spacer material is anisotropically etched such that it is removed from horizontally oriented surfaces at a faster rate than from vertically oriented surfaces. The duration of the anisotropic etch is preferably terminated after the spacer material has been removed from a large portion of the horizontally oriented surfaces but before the spacer material can be completely removed from the vertically extending sidewall surfaces. The lateral thickness of each sidewall spacer retained upon a sidewall surface is thus dictated by the duration of the anisotropic etch step and by the thickness of the spacer material deposited upon the sidewall surfaces. Although chemical-vapor deposition ("CVD") is not as vertically-directed as physical vapor deposition, the CVD deposited material still tends to accumulate more quickly upon horizontally oriented surfaces than upon vertically oriented surfaces. The accumulation of the CVD deposited material is particularly poor upon tall vertical surfaces. Accordingly, the shorter the height of the sidewall surfaces (i.e., the step height of the sacrificial material), the less spacer material needs to be deposited to achieve good coverage of the vertically oriented sidewall surfaces. Accordingly, the lateral thickness of each sidewall spacer may be reduced by decreasing the duration of the anisotropic etch step and the height of the sidewall surfaces.

Also, in both embodiments the gate conductors serve as masks to underlying channel regions of a semiconductor substrate during subsequent implantation of impurities into the substrate. Therefore, the width of each gate conductor dictates the physical channel length of an ensuing transistor. Absent using optical lithography to define the width of the gate conductors, the minimum size of the physical channel length is no longer sacrificed by the limited resolution of an optical system. As such, the lateral thickness of each gate conductor may be scaled down to minimize the physical channel length, and hence the Leff, of an ensuing transistor. Reducing the thickness of each gate conductor may be accomplished by forming sidewall spacers of small lateral thicknesses. Moreover, in the embodiment in which the sidewall spacers are formed upon the sidewall surfaces of the sacrificial material within an opening, the spacing between the spacers may be less than the minimum spacing definable using lithography. The opening within which the sidewall spacers are formed is defined using lithography. The minimum lateral width of the opening is thus limited by the constraints of lithography. The lateral distance between the sidewall spacers formed at the periphery of the opening is less than the minimum width of the opening and thus less than the minimum spacing definable using lithography. Formation of the gate conductors underneath such closely spaced sidewall spacers affords minimization of the spacing between the gate conductors. As such, this embodiment provides the advantage of reduced spacing between the gate conductors of series-connected transistors. High-speed operation and increased complexity of an integrated circuit employing such densely-packed gate conductors of reduced widths is therefore made possible by the present invention.

According to one embodiment, a gate dielectric is deposited across a semiconductor topography. The gate dielectric is preferably a material having a relatively high dielectric constant, K, greater than about 3.8. An opening is formed through the gate dielectric using optical lithography, followed by an etch technique, e.g., a dry, plasma etch. An silicon dioxide ("oxide") layer may then be thermally grown upon an exposed portion of the substrate at the base of the opening. The oxide layer may later serve as an etch stop layer. Thereafter, a sacrificial material is deposited into the opening to a level spaced above the upper surface of the gate dielectric. The upper surface of the sacrificial material may be planarized and removed down to approximately the same level as the upper surface of the gate dielectric using, e.g., chemical-mechanical polishing ("CMP") or sacrificial etchback. The sacrificial material may be any material substantially dissimilar to the gate dielectric. Preferably, the sacrificial material is silicon nitride or a metal. The upper surface of the gate dielectric may then be removed down to a level spaced below the upper surface of the sacrificial material using, e.g., an anisotropic etch which is highly selective to the gate dielectric relative to the sacrificial material. The etch duration is terminated after about ⅓ to ½ of the thickness of the gate dielectric has been removed. As a result of the removal an upper portion of the gate dielectric, opposed sidewall surfaces of the sacrificial material are exposed.

Polysilicon is then CVD deposited across the semiconductor topography embodying the sidewall surfaces. The polysilicon is anisotropically etched to form gate conductors in the form of polysilicon spacers upon the sidewall surfaces of the masking layer. The etch duration is selected to last until only a pre-defined lateral thickness of the polysilicon remains upon the sidewall surfaces. The gate conductors are thus formed above select regions of the gate dielectric. The height of the gate conductors is dictated by both the thickness of the polysilicon deposited across the topography and by the thickness of the portion of the gate dielectric removed to define the height of the sidewall surfaces. Assuming that knowledge of the deposition rate of the polysilicon and the etch rate of the gate dielectric is known, the height of the gate conductors may be controlled by varying the duration of those deposition and etch steps. Moreover, the lateral thickness of the gate conductors is somewhat affected by the height of the sidewall surfaces of the sacrificial layer, and hence by the duration of the etch performed to remove a portion of the gate dielectric from the sidewall surfaces.

Subsequent to forming gate conductors upon select regions of the gate dielectric, portions of the gate dielectric not covered by the gate conductors are etched to the underlying substrate. Those portions are selectively etched using, e.g., an anisotropic etch which exhibits a high selectivity for the gate dielectric as compared to the polysilicon gate conductors. An oxide is then thermally grown across exposed regions of the substrate laterally adjacent the gate dielectric. Thereafter, the sacrificial material is selectively etched to the underlying oxide layer which serves as an etch stop layer. The presence of the oxide layer protects the underlying substrate from being etched. A lightly doped drain ("LDD") implant of dopant species may be forwarded into regions of the substrate unmasked by the gate conductor/gate dielectric structures to form LDD areas. A relatively thin dielectric layer may then be deposited across the exposed surfaces of the semiconductor topography to form a masking layer upon the opposed sidewall surfaces of the gate conductor/gate dielectric structures. A heavily doped source/drain implant which is self-aligned to the exposed lateral surfaces of the dielectric layer is then forwarded into the substrate to form source/drain regions. The resulting series-connected transistors have a mutual source/drain region. The channel region of each transistor is interposed between LDD areas arranged on opposite sides of a gate conductor. Therefore, the channel length of each transistor is mandated by the lateral width of an overlying gate conductor. The high K value of each gate dielectric provides for increased gate-to-substrate capacitance, and thus results in the transistor threshold voltage, $V_T$, being reduced. Further, the reduction of the gate-to-substrate capacitance is advantageously accomplished without resorting to decreasing the gate dielectric thickness. In other words, the thickness of each gate dielectric can be increased and still achieve the same $V_T$ as a gate dielectric composed of a material having a lower K value. Therefore, the probability that the gate dielectrics will breakdown is significantly reduced, and problems such as current inadvertently passing through the gate dielectrics and electron entrapment within the gate dielectrics are less likely to be encountered.

In an alternate embodiment, semiconductor substrate is provided upon which a gate dielectric is formed. The gate dielectric may, e.g., comprise oxide or other materials having a higher dielectric constant than oxide. A polysilicon layer is CVD deposited across the gate dielectric. Portions of the polysilicon layer may be removed using lithography and an etch technique to define sidewall surfaces for the polysilicon layer. A sacrificial material may then be formed across the gate dielectric and the polysilicon layer. The sacrificial material preferably comprises photoresist, but may be any material dissimilar to polysilicon and the gate dielectric material. The sacrificial material is patterned using lithography such that an opening extends through the sacrificial material to the upper surface of the polysilicon layer. The opening is interposed between opposed sidewall surfaces of the sacrificial material that extend above the polysilicon layer. A spacer material which is substantially dissimilar to the sacrificial material and the polysilicon layer is then deposited across exposed surfaces of the topography. The spacer material may, e.g., comprise oxide, silicon nitride, or silicon oxynitride. The spacer material is anisotropically etched to form sidewall spacers upon the opposed sidewall surfaces of the sacrificial material. In this manner, the spacers are configured a spaced distance apart within the opening above select regions of the underlying polysilicon layer.

After removing the sacrificial material, portions of the polysilicon layer not arranged underneath the sidewall spacers are etched to define polysilicon gate conductors. An etch technique is used which is highly selective to the polysilicon as compared to the spacer material. The lateral width of each gate conductor is the same as the lateral thickness of the overlying sidewall spacer. Subsequently, the sidewall spacers may be selectively removed, and an LDD implant which is self-aligned to the opposed sidewall surfaces of the gate conductor may be forwarded into the semiconductor substrate. The LDD implant forms LDD areas within the upper surface of the substrate. A dielectric layer may then be deposited upon the opposed sidewall surfaces of the gate conductors. A heavily doped source/drain implant which is self-aligned to the exposed lateral surfaces of the dielectric layer is then forwarded into the substrate to form heavily doped source/drain regions. Since the source/drain implant is performed at a higher dose than the LDD implant, the heavily doped source/drain regions dominate those portions of the LDD areas not arranged underneath the dielectric layer. One of the source/drain regions is mutually shared by two series-connected transistors. The channel lengths of the resulting transistors extend between the LDD areas formed on opposite sides of the gate conductors. Accordingly, each channel length is dictated by the width of the overlying gate conductor.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
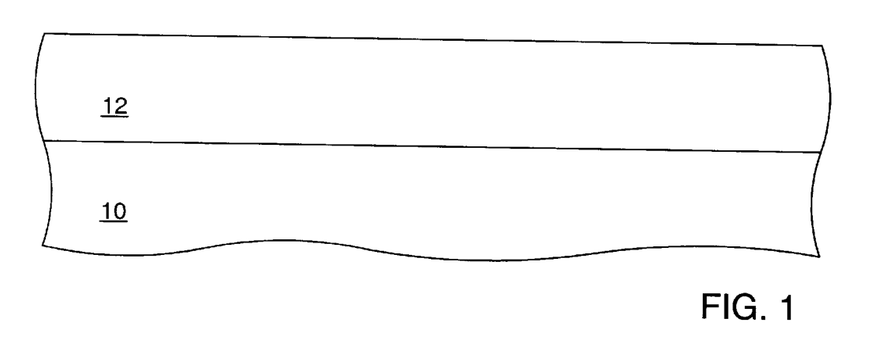
FIG. 1 is a cross-sectional view of a semiconductor topography according to a first embodiment of the present invention, wherein a gate dielectric is formed across a semiconductor substrate.
Figure 2:
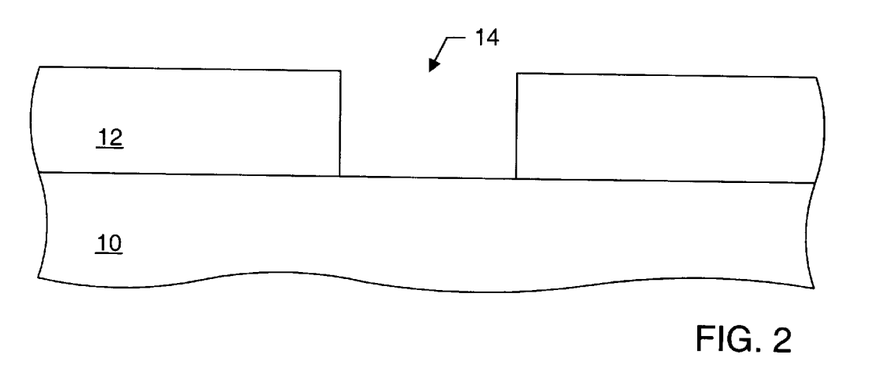
FIG. 2 is a cross-sectional view of the semiconductor topography, wherein an opening is etched through the gate dielectric, subsequent to the step in FIG. 1.
Figure 3:
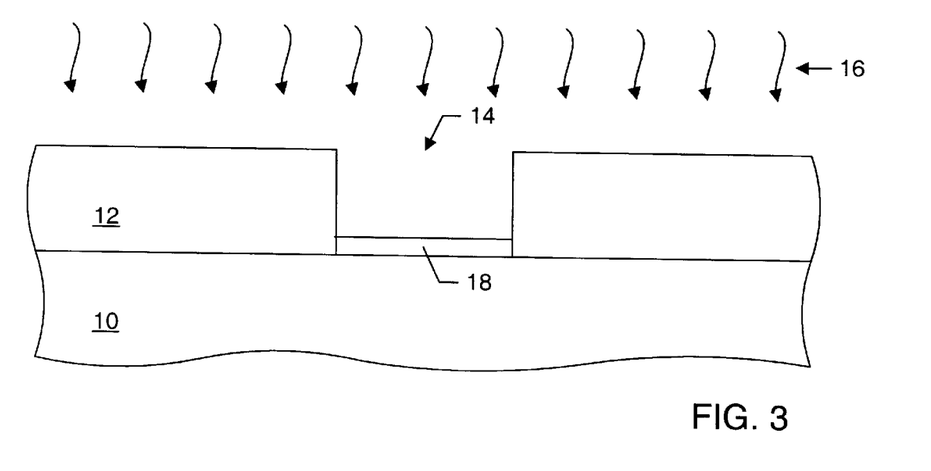
FIG. 3 is a cross-sectional view of the semiconductor topography, wherein an oxide layer is thermally grown upon the substrate at the base of the opening, subsequent to the step in FIG. 2.

FIGS. 1–10 illustrate the formation of a transistor according to one embodiment of the present invention. Turning to FIG. 1, a single crystalline silicon substrate 10 is depicted upon which a gate dielectric 12 has been deposited. Substrate 10 is slightly doped with p-type or n-type dopant species. Isolation structures may be arranged at spaced distances apart within substrate 10 to isolate ensuing active areas from each other. Gate dielectric 12 is preferably a dielectric material having a dielectric constant, K, greater than about 3.8. Examples of appropriate high K dielectric materials include, but are not limited to, barium strontium titanate, lead lanthanum zirconate titanate, barium zirconate titanate, cerium oxide, and tin oxide. As shown in FIG. 2, an opening 14 is then formed through gate dielectric 12 to substrate 10 using optical lithography and an etch technique, e.g., a dry, plasma etch. The etch duration is chosen to terminate before substantial portions of the substrate 10 can be etched. Thereafter, an oxide layer 18 may be thermally grown across an exposed region of substrate 10 by subjecting the silicon-based substrate to thermal radiation 16 in an oxygen-bearing ambient. Oxide layer 18 may later serve as a protective etch stop layer to inhibit etching of the underlying region of substrate 10.

Figure 4:
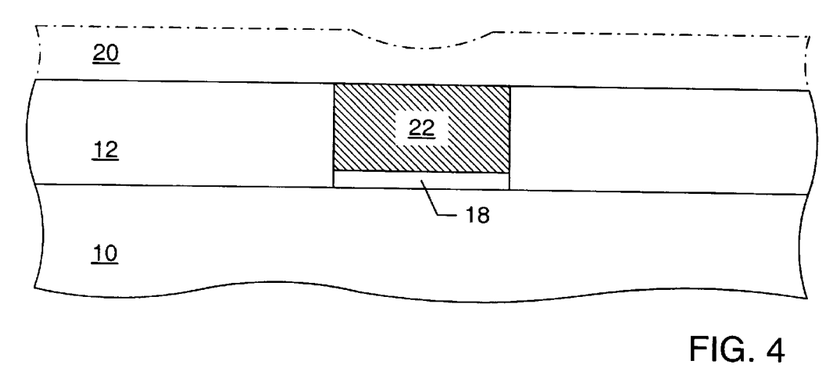
FIG. 4 is a cross-sectional view of the semiconductor topography, wherein a sacrificial material is formed within the opening such that an upper surface of the sacrificial material is approximately level with the upper surface of the gate dielectric, subsequent to the step in FIG. 3.
Figure 5:
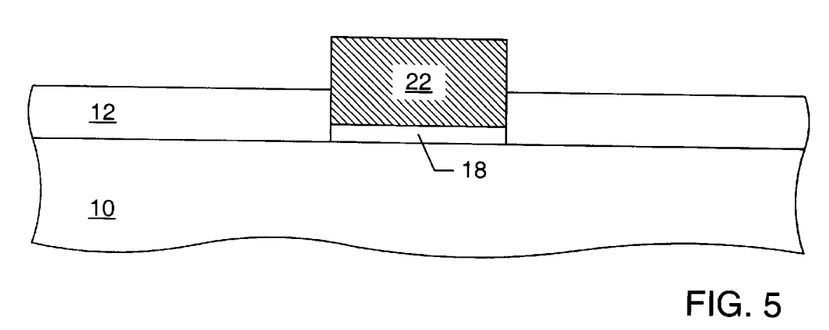
FIG. 5 is a cross-sectional view of the semiconductor topography, wherein the upper surface of the gate conductor is etched to a level spaced below the upper surface of the sacrificial material to expose vertically extending sidewall surfaces encompassing the sacrificial material, subsequent to the step in FIG. 4.

Turning to FIG. 4, a sacrificial material 22 is then deposited into the opening to a level spaced above the upper surface of gate dielectric 12. A portion 20 of the sacrificial material may be removed from above gate dielectric 12 using, e.g., CMP or sacrificial etchback. In this manner, the upper surface of sacrificial material 22 is substantially planarized and removed to a level approximately commensurate with the upper surface of gate dielectric 12. Sacrificial material 22 may be any material substantially dissimilar to gate dielectric 12. Sacrificial material 22 may, e.g., comprise titanium, copper, aluminum, tungsten, titanium nitride, or silicon nitride. Subsequently, as shown in FIG. 5, the upper surface of gate dielectric 12 is etched to a level spaced below the upper surface of sacrificial material 22, thereby removing approximately ⅓ to ½ of the original thickness of gate dielectric 12. Preferably, an anisotropic etch technique which exhibits a high selectivity to gate dielectric 12 relative to sacrificial material 22 is used for the removal of gate dielectric 12. As a result of etching gate dielectric 12, opposed sidewall surfaces formed laterally about the periphery of sacrificial material 22 become partially exposed.

Figure 6:
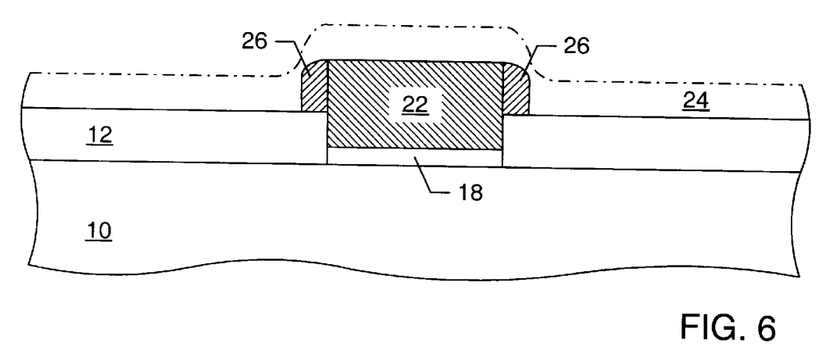
FIG. 6 is a cross-sectional view of the semiconductor topography, wherein polysilicon spacers which represent gate conductors are formed exclusively upon, and extending a desired distance from, the sidewall surfaces of the sacrificial material above select regions of the gate dielectric, subsequent to the step in FIG. 5.
Figure 7:
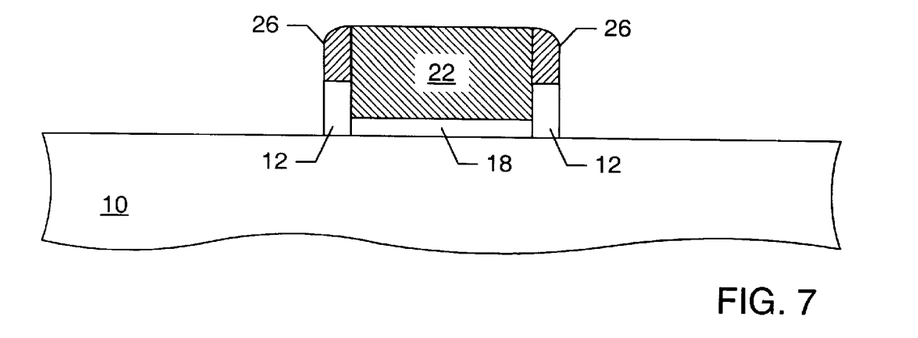
FIG. 7 is a cross-sectional view of the semiconductor topography, wherein portions of the gate dielectric exclusive of those select regions underneath the gate dielectrics are etched from the semiconductor substrate, subsequent to the step in FIG. 6.
Figure 8:
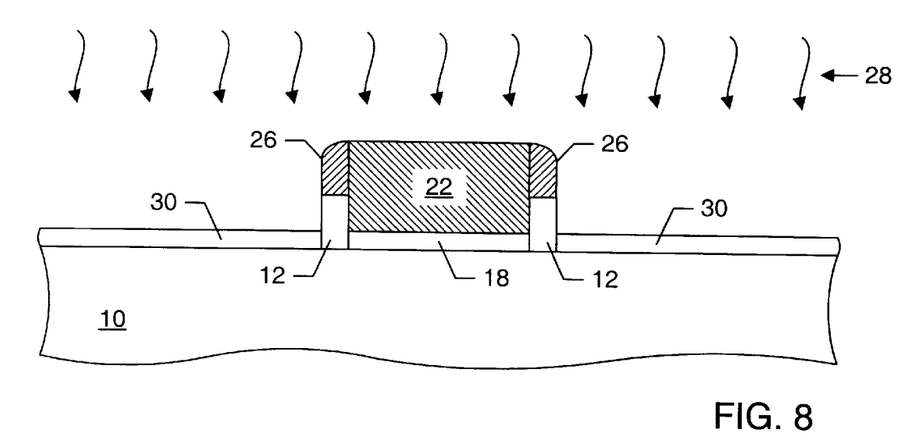
FIG. 8 is a cross-sectional view of the semiconductor topography, wherein an oxide layer is thermally grown across exposed regions of the semiconductor substrate, subsequent to the step in FIG. 7.

FIG. 6 depicts the formation of polysilicon gate conductors 26 upon, and extending laterally form, the vertically extending sidewall surfaces of sacrificial material 22. Gate conductors 26 are formed by first CVD depositing polysilicon from, e.g., a silane source, across gate dielectric 12 and sacrificial material 22. The polysilicon is then anisotropically etched such that a portion 24 of the polysilicon is removed. The etch duration is chosen to terminate after only a pre-defined thickness of polysilicon remains upon the opposed sidewall surfaces of sacrificial material 22. Polysilicon spacers which embody gate conductors 26 are thus formed above select regions of gate dielectric 12. The resulting gate conductors 26 may have a thickness of, e.g., 0.03 to 0.05 micron. As shown in FIG. 7, portions of gate dielectric 12 exclusive of those select regions covered by gate conductors 26 are etched to substrate 10 using, e.g., an anisotropic etch highly selective to gate dielectric 12 as compared to polysilicon gate conductors 26. Turning to FIG. 8, an oxide layer 30 may then be formed upon exposed portions of silicon-based substrate 10 by, e.g., exposing the substrate to thermal radiation 28 in an oxygen-bearing ambient.

Figure 9A:
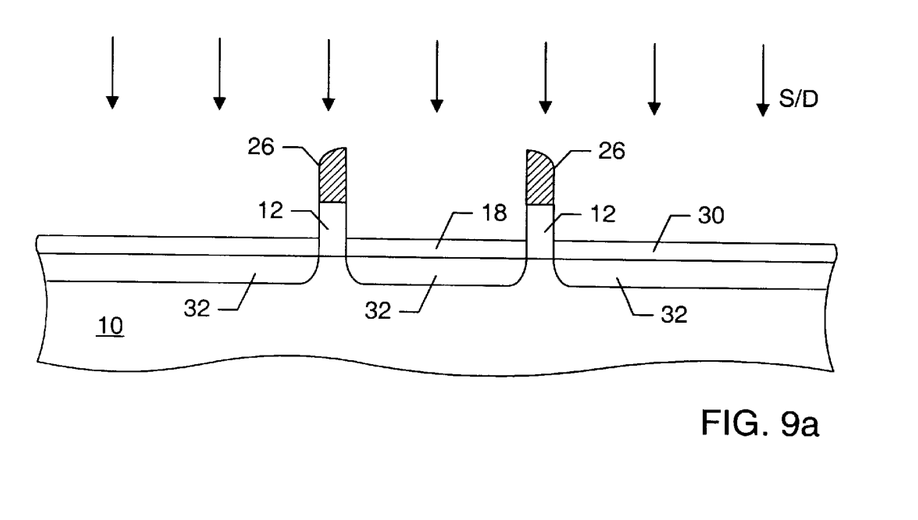
FIG. 9a is a cross-sectional view of the semiconductor topography according to one embodiment, wherein a source/drain implant which is self-aligned to the opposed sidewall surfaces of the gate conductor/gate dielectric structures is forwarded into the semiconductor substrate, subsequent to the step in FIG. 8.

FIG. 9a depicts one embodiment of the processing step following the step shown in FIG. 8. Sacrificial material 22 is selectively removed using, e.g., an anisotropic etch which exhibits a high selectivity to sacrificial material 22 relative to gate conductors 26, gate dielectrics 12, and oxide layer 18. Oxide layer 18 serves as an etch stop layer in that it protects substrate 10 from being etched before the etch duration of sacrificial material 22 can be terminated. A heavily doped source/drain ("S/D") implant which is self-aligned to the opposed sidewall surfaces of gate conductors 26 is forwarded into substrate 10 to form heavily doped source/drain regions 32. If PMOSFET transistors are being fabricated, p-type species are implanted, and if NMOSFET transistors are being fabricated, n-type species are implanted. Some commonly used p-type dopants are boron or boron difluoride, and some commonly used n-type dopants are arsenic or phosphorus. The implanted dopant species may be opposite in type to the dopant species positioned within the bulk of substrate 10. The concentration of dopant species is chosen to effectuate whatever threshold voltage is required to operate, within the design specification, the ensuing transistors. One of the source/drain regions 32 is shared by a pair of series-connected transistors. The presence of oxide layers 18 and 30 provides for adequate distribution of the implanted impurities.

Figure 9B:
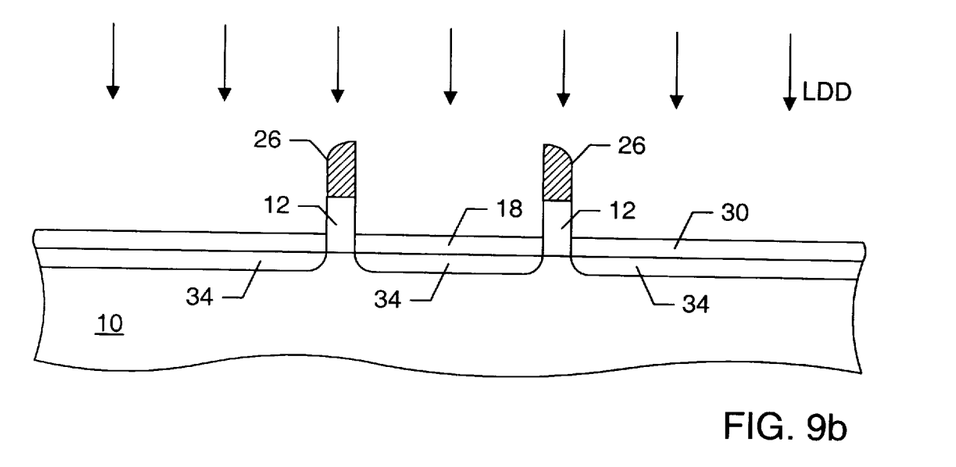
FIG. 9b is a cross-sectional view of a semiconductor topography according to another embodiment, wherein an LDD implant which is self-aligned to the opposed sidewall surfaces of the gate conductor/gate dielectric structures is forwarded into the semiconductor substrate, subsequent to the step in FIG. 8.
Figure 10:
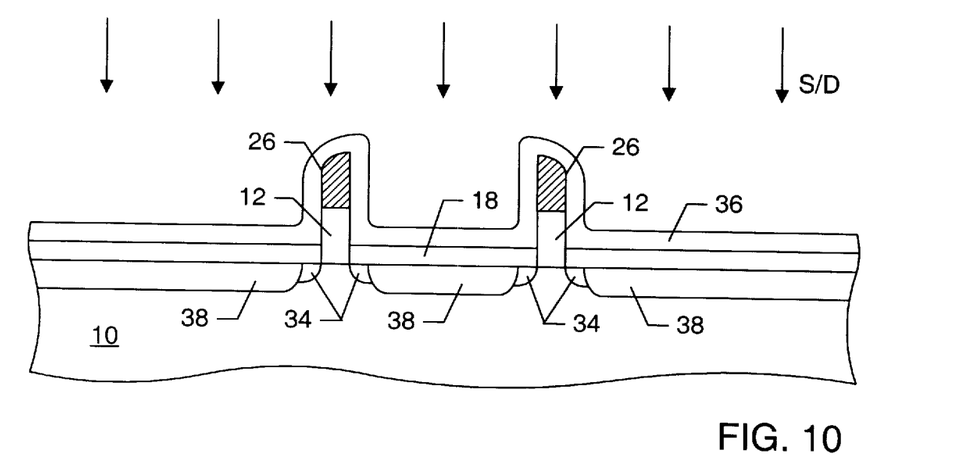
FIG. 10 is a cross-sectional view of the semiconductor topography, wherein a dielectric layer is deposited across the opposed sidewall surfaces of the gate conductor/gate dielectric structures and a source/drain implant is forwarded into the substrate, subsequent to the step in FIG. 9b.

FIG. 9b depicts an alternate embodiment to the one shown in FIG. 9a. An LDD implant which is self-aligned to the opposed sidewall surfaces of gate conductors 26 is forwarded into substrate 10, resulting in the formation of LDD areas 34. LDD areas 34 are arranged on opposite sides of channel regions residing directly below gate conductor 26. The implant energy and dose of the LDD implant is less than that of the S/D implant of FIG. 9a. As such, LDD areas 34 are shallower in depth than source/drain regions 32 depicted in FIG. 9a. Subsequent to the step shown in FIG. 9b, a dielectric layer 36 comprising, e.g., oxide, silicon nitride, or silicon oxynitride is deposited across the semiconductor topography, as depicted in FIG. 10. Alternatively, dielectric spacers may be formed only upon the opposed sidewall surfaces of gate conductors 26/gate dielectrics 12. A S/D implant may then be forwarded into substrate 10 which is self-aligned to the exposed lateral surfaces of dielectric layer 36 to form source/drain regions 38 within substrate 10 laterally spaced from gate conductors 26. Source/drain regions 38 consume portions of LDD areas 34 to form graded junctions in which the dopant concentration increases in a lateral direction away from gate conductors 26.

Figure 11:
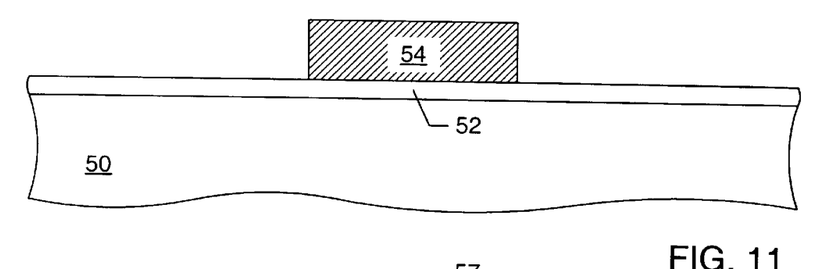
FIG. 11 is a cross-sectional view of the semiconductor topography according to a second embodiment of the present invention, wherein a polysilicon structure is patterned upon a gate dielectric arranged across a semiconductor substrate.
Figure 12:
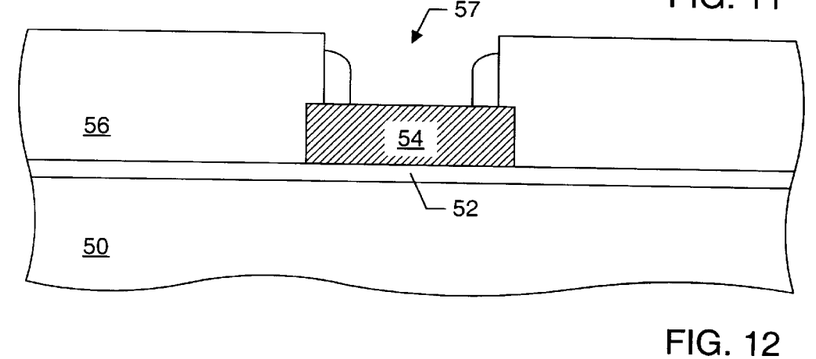
FIG. 12 is a cross-sectional view of the semiconductor topography, wherein a masking or sacrificial material is patterned upon the polysilicon structure such that an opening extends through the sacrificial material between a pair of vertically extending sidewall surfaces, subsequent to the step in FIG. 11.

FIGS. 11–18 illustrate a sequence of processing steps according to another embodiment of the present invention. FIG. 11 depicts a semiconductor substrate 50 which comprises lightly doped single crystalline silicon. A gate dielectric 52 is arranged across the upper surface of substrate 50. Gate dielectric 52 may comprise various insulators, including, but not limited to, oxide, barium strontium titanate, lead lanthanum zirconate titanate, barium zirconate titanate, cerium oxide, and tin oxide. A polysilicon structure 54 is arranged upon gate dielectric 52. Polysilicon structure 54 may comprise polysilicon which has been CVD deposited from, e.g., a silane source. Turning to FIG. 12, a masking or sacrificial layer 56 is then patterned across gate dielectric 52 and polysilicon structure 54 such that an opening 57 extends through the sacrificial layer to the polysilicon structure. Preferably, sacrificial layer 56 comprises photoresist which may be patterned using optical lithography. Sacrificial layer 56 may also be composed of a material other than photoresist, e.g., nitride, as long as the material is dissimilar from polysilicon structure 54 and gate dielectric 52. If sacrificial layer 56 is not photoresist, it may be formed using both lithography and an etch technique, e.g., a dry, plasma etch. Precise alignment of opening 57 to a particular region of the upper surface of polysilicon structure 54 is not critical.

Figure 13:
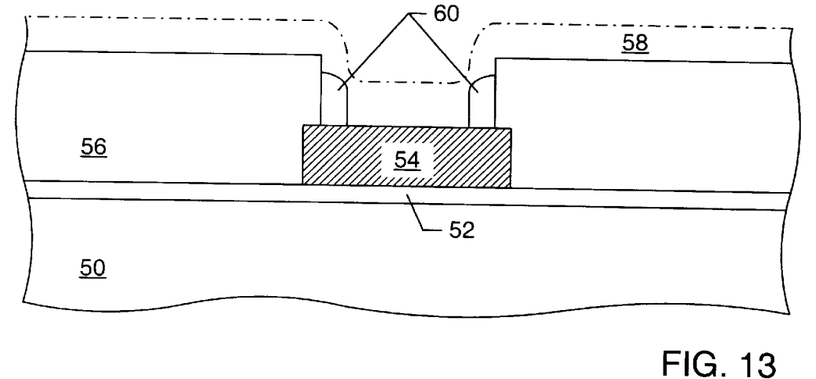
FIG. 13 is a cross-sectional view of the semiconductor topography, wherein sidewall spacers are formed exclusively upon, and extending a desired distance from, the sidewall surfaces of the sacrificial material, subsequent to the step in FIG. 12.
Figure 14:
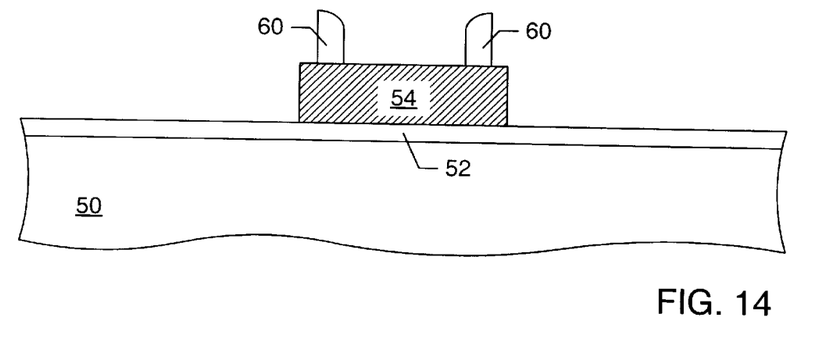
FIG. 14 is a cross-sectional view of the semiconductor topography, wherein the IS sacrificial material is removed while the sidewall spacers are retained above select regions of the polysilicon structure, subsequent to the step in FIG. 13.
Figure 15:
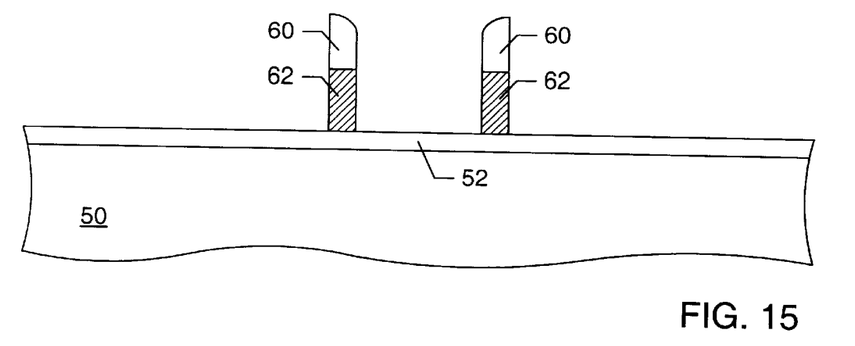
FIG. 15 is a cross-sectional view of the semiconductor topography, wherein portions of the polysilicon structure exclusive of those select regions are etched to define gate conductors exclusively beneath the sidewall spacers, subsequent to the step in FIG. 14.

As shown in FIG. 13, sacrificial sidewall spacers 60 may be formed upon, and extending laterally from, sidewall surfaces which bound sacrificial layer 56 at the periphery of opening 57. Sidewall spacers 60 may be formed by first depositing a spacer material across exposed surfaces of sacrificial layer 56 and polysilicon structure 54. The spacer material is preferably composed of silicon dioxide, silicon nitride, or silicon oxynitride, but may be composed of any material dissimilar from the sacrificial layer material and polysilicon. The spacer material is then anisotropically etched such that a portion 58 of the spacer material is removed. The etch duration is chosen to terminate after only a pre-defined thickness of spacer material remains laterally adjacent the sidewall surfaces of sacrificial layer 56. The resulting sidewall spacers 60 may each have a thickness of, e.g., 0.03 to 0.05 micron and may be laterally spaced apart by a distance of, e.g., 0.1 to 0.16 micron, (i.e., a distance less than the minimum feature size, e.g., 0.2 micron, which can be defined using lithography). FIG. 14 depicts sacrificial layer 56 being selectively removed from the semiconductor topography. Turning to FIG. 15, an anisotropic etch which is highly selective to polysilicon relative to the spacer material is then performed to remove portions of polysilicon structure 54 not covered by sidewall spacers 60. The etch duration is selected to terminate before significant portions of gate dielectric 52 can be removed. In this manner, the geometric shape of a pair of gate conductors 62 are defined exclusively beneath sidewall spacers 60. The opposed sidewall surfaces encompassing the resulting gate conductors 62 are aligned to the opposed lateral surfaces of sidewall spacers 60. As such, the lateral thickness of each sidewall spacer 60 dictates the width of a gate conductor 62 formed beneath the spacer.

Figure 16A:
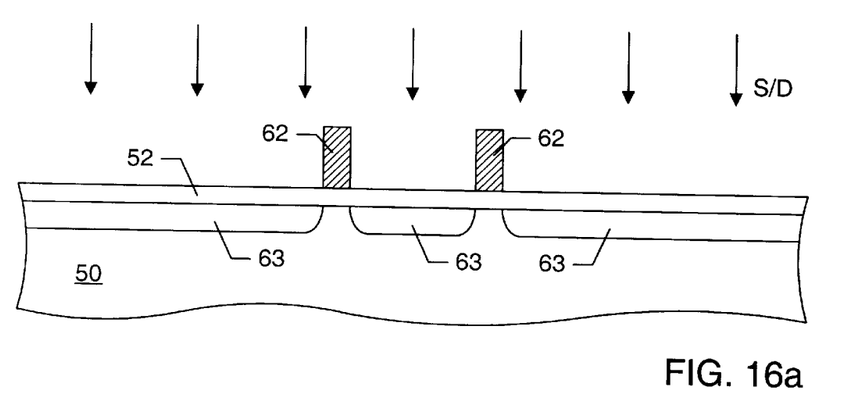
FIG. 16a is a cross-sectional view of the semiconductor topography according to one embodiment, wherein a source/drain implant which is self-aligned to the opposed sidewall surfaces of the gate conductors is forwarded into the semiconductor substrate, subsequent to the step in FIG. 15.
Figure 16B:
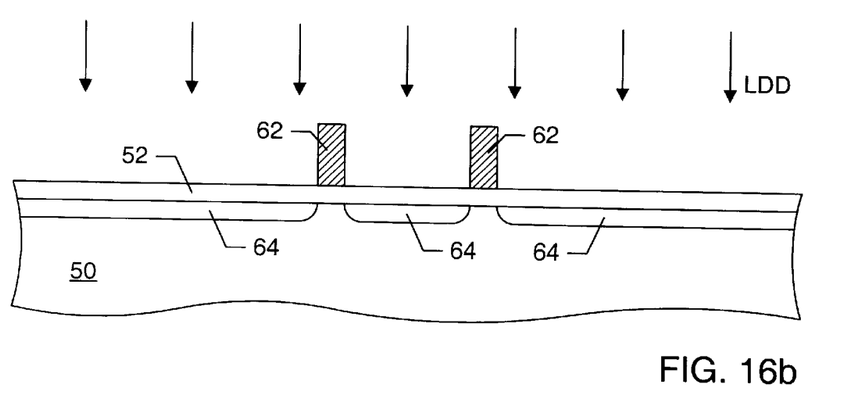
FIG. 16b is a cross-sectional view of the semiconductor topography according to another embodiment, wherein an LDD implant which is self-aligned to the opposed sidewall surfaces of the gate conductors is forwarded into the semiconductor substrate, subsequent to the step in FIG. 15.
Figure 17:
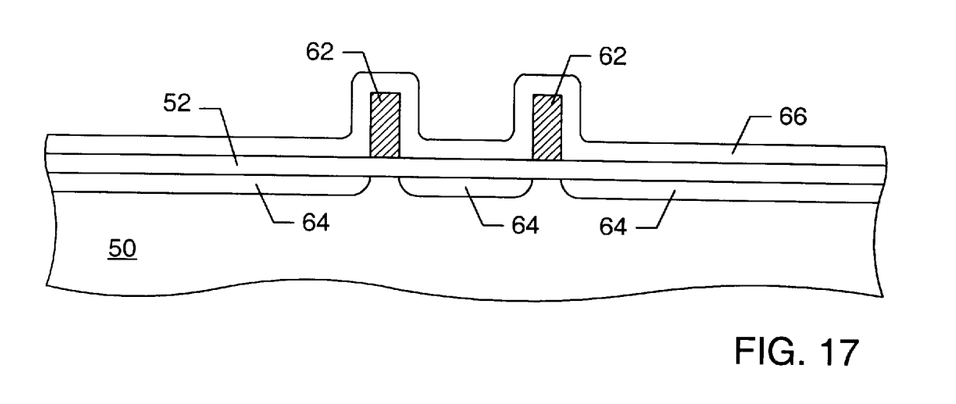
FIG. 17 is a cross-sectional view of the semiconductor topography, wherein a dielectric layer is deposited across the opposed sidewall surfaces of the gate conductors, subsequent to the step in FIG. 16b.
Figure 18:
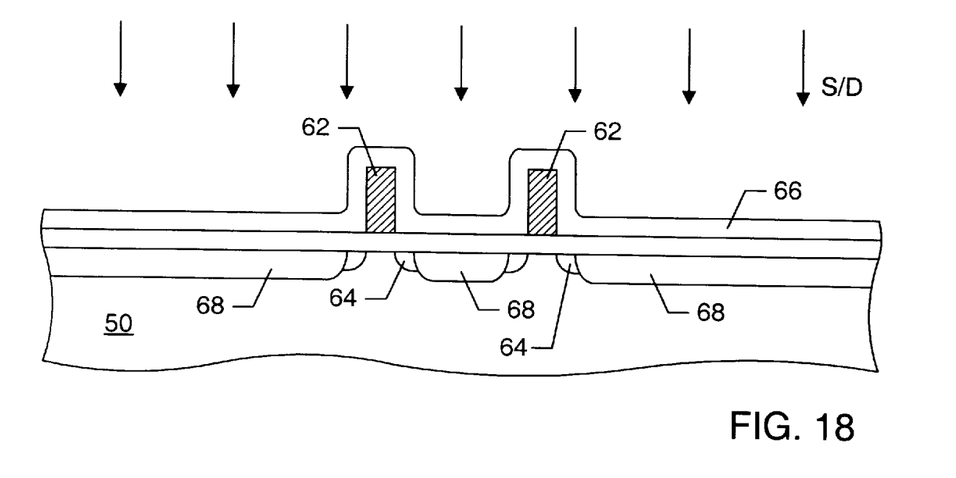
FIG. 18 is a cross-sectional view of the semiconductor topography, wherein a source/drain implant which is self-aligned to the exposed lateral surfaces of the dielectric layer is forwarded into the semiconductor substrate, subsequent to the step in FIG. 17.

FIG. 16a depicts one embodiment of the processing step following the step shown in FIG. 15. Sidewall spacers 60 may be selectively removed before or after a SID implant is forwarded into substrate 50 to form heavily doped source/drain regions 63. The implanted dopant species are opposite in type to those positioned within channel regions of substrate 50 residing directly below gate conductors 62. The presence of gate dielectric 52 affords adequate distribution of the implanted impurities. Alternately, as shown in FIG. 16b, an LDD implant which is self-aligned to the opposed sidewall surfaces of gate conductor 62 may be forwarded into semiconductor substrate 10 before or after the removal of sidewall spacers 60. As a result of the LDD implant, LDD areas 64 are formed within substrate 10 laterally adjacent channel regions of the substrate. Subsequent to the step in FIG. 16b, a dielectric layer 66 comprising, e.g., oxide, silicon nitride, or silicon oxynitride, may be deposited across exposed surfaces of the semiconductor topography, as shown in FIG. 17. Alternately, dielectric spacers may be formed laterally adjacent the opposed sidewall surfaces of gate conductors 62. Subsequently, as depicted in FIG. 18, a S/D implant which is self-aligned to the exposed lateral surfaces of dielectric layer 66 may then be forwarded into substrate 10 to form source/drain regions 68. One of the source/drain regions 68 is shared by a pair of series-connected transistors. The source/drain implant is performed at a higher energy and dose than the previous LDD implant. The source/drain implant employs the same type of dopant species as the LDD implant. As such, source/drain regions 68 consume portions of the previous LDD areas 64 which are shallower and have a lower concentration of dopants than source/drain regions 68. Thus, LDD areas 64 become arranged exclusively below portions of the dielectric layer 66 which extend laterally from opposed sidewall surfaces of gate conductors 62. The combination of LDD areas 64 and source/drain regions 68 form graded junctions on opposite sides of channel regions arranged directly below gate conductors 62. Substrate 50 may subsequently be annealed to activate and position the as-implanted impurities within the graded junctions.

It will be appreciated to those skilled in the art having the benefit of this disclosure that this invention is believed to provide a method for forming a transistor having an ultra short channel length dictated by the width of a sidewall spacer which either embodies a gate conductor for the transistor or is used to pattern an underlying gate conductor. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
   etching an opening through a gate dielectric to a semiconductor substrate residing underneath the gate dielectric;
   forming a sacrificial material substantially dissimilar to the gate dielectric within the opening;
   etching a dielectric upper surface of the gate dielectric to a level spaced below a sacrificial upper surface of the sacrificial material to expose a first sidewall surface of the sacrificial material; and
   forming a first polysilicon spacer upon the sidewall surface of the sacrificial layer, thereby defining a first gate conductor above a first select region of the gate dielectric.

2. The method of claim 1, wherein said etching the dielectric upper surface also exposes a second sidewall surface of the sacrificial material.

3. The method of claim 2, further comprising forming a second polysilicon spacer upon the second sidewall surface concurrent with said forming a first polysilicon spacer, thereby defining a second gate conductor above a second select region of the gate dielectric.

4. The method of claim 3, further comprising etching portions of the gate dielectric exclusive of the first and second select regions, thereby exposing portions of the semiconductor substrate.

5. The method of claim 1, further comprising forming an oxide layer upon a portion of the semiconductor substrate exposed by the opening prior to said forming a sacrificial material in the opening.

6. The method of claim 4, further comprising thermally growing an oxide upon exposed said portions of the semiconductor substrate.

7. The method of claim 6, further comprising selectively etching away the sacrificial material.

8. The method of claim 3, wherein said forming a first polysilicon spacer and said forming a second polysilicon spacer comprises:
   depositing a polysilicon layer across the gate dielectric and the sacrificial material; and
   anisotropically etching the polysilicon to remove the polysilicon layer except from upon the first sidewall surface and the second sidewall surface of the sacrificial material.

9. The method of claim 1, wherein said etching an opening comprises etching regions of the gate dielectric exposed by a photoresist layer.

10. The method of claim 1, wherein said etching a dielectric upper surface of the gate dielectric comprises removing approximately ⅓ to ½ of the thickness of the gate dielectric.

11. The method of claim 1, wherein the gate dielectric comprises a material having a dielectric constant greater than approximately 3.8.

12. The method of claim 1, wherein the gate dielectric comprises a material selected from the group consisting of barium strontium titanate, lead lanthanum zirconate titanate, barium zirconate titanate, cerium oxide, and tin oxide.

13. The method of claim 1, wherein the sacrificial material comprises a material selected from the group consisting of aluminum, titanium, tungsten, copper, titanium nitride, and silicon nitride.

14. The method of claim 3, further comprising:
   forwarding a lightly doped drain implant which is self-aligned to opposed sidewall surfaces of the first and second gate conductors into the substrate to form lightly doped drain areas;
   forming a dielectric layer laterally adjacent the opposed sidewall surfaces of the first and second gate conductors; and
   forwarding a source/drain implant which is self-aligned to exposed lateral surfaces of the dielectric layer into the substrate to form source and drain regions.

15. The method of claim 3, further comprising forwarding a source/drain implant which is self-aligned to opposed sidewall surfaces of the first and second gate conductors into the substrate to form source and drain regions.

16. A method for forming a transistor comprising:
   patterning a sacrificial material upon a polysilicon layer spaced above a semiconductor substrate, thereby defining all opening interposed between a pair of sidewall surfaces;
   forming a pair of sacrificial spacers within the opening upon the pair of sidewall surfaces such that the sacrificial spacers reside above select regions of the polysilicon layer;
   removing the sacrificial material from the polysilicon layer; and
   etching portions of the polysilicon layer exclusive of the select regions to define a pair of gate conductors spaced laterally from each other.

17. The method of claim 16, wherein the sacrificial material comprises photoresist, and wherein said patterning a sacrificial material comprises lithographically patterning the photoresist.

18. The method of claim 16, further comprising etching portions of the polysilicon layer to define a pair of opposed lateral surfaces for the polysilicon layer prior to said patterning a sacrificial material.

19. The method of claim 16, wherein the sacrificial spacers comprise a material selected from the group consisting of silicon oxide, silicon nitride, and silicon oxynitride, and further comprising selectively etching the pair of sacrificial spacers from the pair of gate conductors.

20. The method of claim 16, further comprising forwarding a lightly doped drain implant which is self-aligned to opposed sidewall surfaces of the pair of gate conductors into the substrate to form lightly doped drain areas;

forming a dielectric layer laterally adjacent the opposed sidewall surfaces of the pair of gate conductors; and forwarding a source/drain implant which is self-aligned to exposed lateral surfaces of the dielectric layer into the substrate to form source and drain regions.

21. The method of claim 20, wherein the dielectric layer comprises silicon dioxide.

22. The method of claim 16, further comprising forwarding a source/drain implant which is self-aligned to opposed sidewall surfaces of the pair of gate conductors into the substrate to form source and drain regions.

23. The method of claim 16, wherein said forming the pair of sidewall spacers comprises:

depositing a polysilicon layer across the sacrificial material and the polysilicon layer; and anisotropically etching the polysilicon to remove the polysilicon layer except from upon the pair of sidewall surfaces of the sacrificial material.

* * * * *